(12) United States Patent
Logan

(10) Patent No.: US 6,683,508 B1
(45) Date of Patent: Jan. 27, 2004

(54) SYSTEM AND METHOD OF INCREASING A SELF-RESONANT FREQUENCY OF A TUNING CIRCUIT AND AN OSCILLATOR EMPLOYING THE SAME

(75) Inventor: Shawn M. Logan, Andover, MA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/667,483

(22) Filed: Sep. 22, 2000

(51) Int. Cl.[7] ................................................ H03B 5/08
(52) U.S. Cl. ............... 331/167; 331/117 R; 331/108 B; 331/108 C; 331/36 L; 336/147; 334/64; 333/167
(58) Field of Search .............................. 331/108 C, 167, 331/108 B, 36 L, 117 R; 333/167; 336/147, 150, 87, 134, 178; 334/64; 438/381

(56) References Cited

U.S. PATENT DOCUMENTS

| | | | |
|---|---|---|---|
| 4,063,193 A | 12/1977 | Wilcox | 331/117 R |
| 5,025,229 A | 6/1991 | Hasegawa et al. | 331/107 |
| 5,157,356 A | 10/1992 | Wedge | 331/60 |
| 5,574,405 A | 11/1996 | Razavi | 331/2 |
| 5,606,295 A | 2/1997 | Ohara et al. | 331/116 FE |
| 6,025,765 A | * 2/2000 | Brown | 333/215 |
| 6,101,371 A | 8/2000 | Barber et al. | 455/73 |

OTHER PUBLICATIONS

"Microwave Inductors and Capacitors in Standard Multi-level Interconnect Silicon Technology" by Joachim N. Burghartz, Mehmet Soyuer and Keith A. Jenkins: 1996 IEEE; pp. 100–104.

"RF Circuit Design Aspects of Spiral Inductors in Silicon" by Joachim N. Burghartz, D. C. Edelstein. Mehmet Soyuer, H. A. Ainspan and Keith A. Jenkins; 1998 IEEE; pp. 2028–2034.

"Optimization of High Q CMOS=Compatible Microwave Inductors Using Silicon CMOS Technology" by Min Park, Seonghearn Lee, Hyun Kyu Yu and Kee Soo Nam; 1997 IEEE; pp. 129–132.

"Phase Noise to Carrier Ratio in LC Oscillators" by Quitting Huang, IEEE; Jul. 2000; pp. 965–980.

* cited by examiner

Primary Examiner—Arnold Kinkead

(57) ABSTRACT

A segmented inductor for use with a tuning circuit, a method of increasing a self-resonant frequency of a tuning circuit and an oscillator employing the circuit and method. In one embodiment, the tuning circuit includes a first inductive element having a first intrinsic shunt capacitance. The tuning circuit also includes a second inductive element, coupled in series with the first inductive element, having a second intrinsic shunt capacitance. The first and second inductive elements cooperate to reduce a total shunt capacitance associated therewith thereby increasing a self-resonant frequency of the tuning circuit.

31 Claims, 6 Drawing Sheets

SYSTEM AND METHOD OF INCREASING A SELF-RESONANT FREQUENCY OF A TUNING CIRCUIT AND AN OSCILLATOR EMPLOYING THE SAME

TECHNICAL FIELD OF THE INVENTION

The present invention is directed, in general, to electronic circuits and, more specifically, to a system and method of increasing a self-resonant frequency of a tuning circuit and an oscillator employing the same.

BACKGROUND OF THE INVENTION

Harmonic-based oscillators are often employed in system components associated with, for instance, radio frequency (RF) systems wherein phase noise is of concern. The oscillator topology generally incorporates a sustaining amplifier and a tuning circuit. The sustaining amplifier provides sufficient energy during each cycle of operation of the oscillator to make up for any losses associated with resonant structure of the tuning circuit. The tuning circuit generally determines the frequency of oscillation of the oscillator.

Proper operation of an oscillator operating at radio frequencies is typically more difficult to achieve than for oscillators operating at lower frequencies. At radio frequencies, the available gain of the amplifiers is usually somewhat limited and the losses due to parasitic elements associated therewith may become significant. In general, low loss radio frequency capacitors and moderate gain radio frequency amplifiers may be constructed in silicon substrate integrated circuits using conventional fabrication processes designed for radio frequency analog circuits. Technology issues, however, limit the availability of very low loss, radio frequency silicon substrate integrated inductors unless more complex fabrication processes are used.

In some applications, this situation may be avoided by incorporating an external inductive component with the integrated circuit. A radio frequency low loss inductor may be located proximate an integrated circuit on a hybrid assembly containing the integrated circuit or adjacent to the integrated circuit on a printed wiring board. The use of an external inductor typically adds parasitic capacitance and stray inductance that usually degrades the performance of a radio frequency oscillator. These unwanted elements create energy losses that negatively affect the phase noise stability and general operation of the oscillator. See, for instance, "Phase Noise to Carrier Ratio in LC Oscillators," by Qiuting Huang, IEEE Transactions on Circuits and Systems: Fundamental Theory and Applications, Vol. 47, No. 7, pps. 965–980, July 2000, which is incorporated by reference, for a more detailed explanation of the phenomenon.

An additional potential source of loss associated with an oscillator involves the self-resonant frequency of the tuned circuit elements that determine the frequency of oscillation. The impedance of a tuned circuit may be expressed as having both real and imaginary parts. The magnitude of both the real and imaginary parts are frequency dependent. The real part increases from a direct current (DC) resistance value at low frequency to a maximum value at its self-resonant frequency.

In order to maintain a stable oscillation condition, the active part of an oscillator should be capable of adjusting to the magnitude of the real part of this impedance at the frequency of oscillation. If this self-resonant frequency is too close to the frequency of oscillation, oscillator instability may easily occur. These conditions offer design challenges for radio frequency oscillators operating in the one to ten Gigahertz (GHz) range. Therefore, it is of great importance from both a cost and performance perspective to reduce the losses associated with an inductor for use in a radio frequency oscillator.

Accordingly, what is needed in the art is a way to reduce the losses associated with an inductor for use in, for instance, radio frequency applications.

SUMMARY OF THE INVENTION

To address the above-discussed deficiencies of the prior art, the present invention provides a segmented inductor for use with a tuning circuit, a method of increasing a self-resonant frequency of a tuning circuit and an oscillator employing the circuit and method.

In one aspect of the present invention, the segmented inductor circuit includes a first inductive element and a second inductive element coupled in series with the first inductive element. An inductance of the first and second inductive elements is substantially equally to a total inductance of the tuning circuit. Additionally, the first and second inductive elements cooperate to reduce a total shunt capacitance associated therewith.

In another aspect of the present invention, the tuning circuit includes a first inductive element having a first intrinsic shunt capacitance. The tuning circuit also includes a second inductive element, coupled in series with the first inductive element, having a second intrinsic shunt capacitance. The first and second inductive elements cooperate to reduce a total shunt capacitance associated therewith thereby increasing a self-resonant frequency of the tuning circuit.

The present invention advantageously introduces the pervasive concept of employing an inductive element in a tuning circuit that has been judiciously segmented. The judicious segmentation of the inductive element allows the summation of the series-coupled shunt capacitances associated with each of the segmented inductors to be smaller than the shunt capacitance associated with a single inductive element. A desired inductance value may be obtained by segmenting the inductor into two or more segments whose series combination provides the advantageous inductance value. The use of a segmented inductor provides a smaller value of the real part of an impedance associated with the inductance at a given frequency. This characteristic thereby reduces the sensitivity of the real part of the impedance to other circuit element variations and generally increases the overall operating "Q" of the circuit employing the segmented inductor element.

In one embodiment of the present invention, the first and second inductive elements have first and second intrinsic resistances, respectively. The value of the intrinsic resistance of an inductive element is typically proportional to the size and length of the conductor forming the inductive element. In an embodiment to be illustrated and described, the first and second inductive elements are substantially equal in size. In a related, but alternative embodiment, the total shunt capacitance is approximately half a first intrinsic shunt capacitance or a second intrinsic shunt capacitance associated with the first and second inductive elements, respectively.

In one aspect of the present invention, the segmented inductor circuit includes a first inductive element and a second inductive element coupled in series with the first inductive element. An inductance of the first and second inductive elements is substantially equal to a total inductance of the tuning circuit. Additionally, the first and second inductive elements cooperate to reduce a total shunt capacitance associated therewith.

In one embodiment of the present invention, the first and second inductive elements are discrete. In a related, but alternative embodiment, the first and second inductive elements are embodied in an integrated circuit. Of course, the first and second inductive elements may be a hybrid combination involving discrete and integrated circuit components.

In one embodiment of the present invention, the tuning circuit is employable with an oscillator. In a related, but alternative embodiment, the oscillator is embodied in an integrated circuit. Alternatively, the tuning circuit may be employed with other circuits requiring frequency selectivity.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
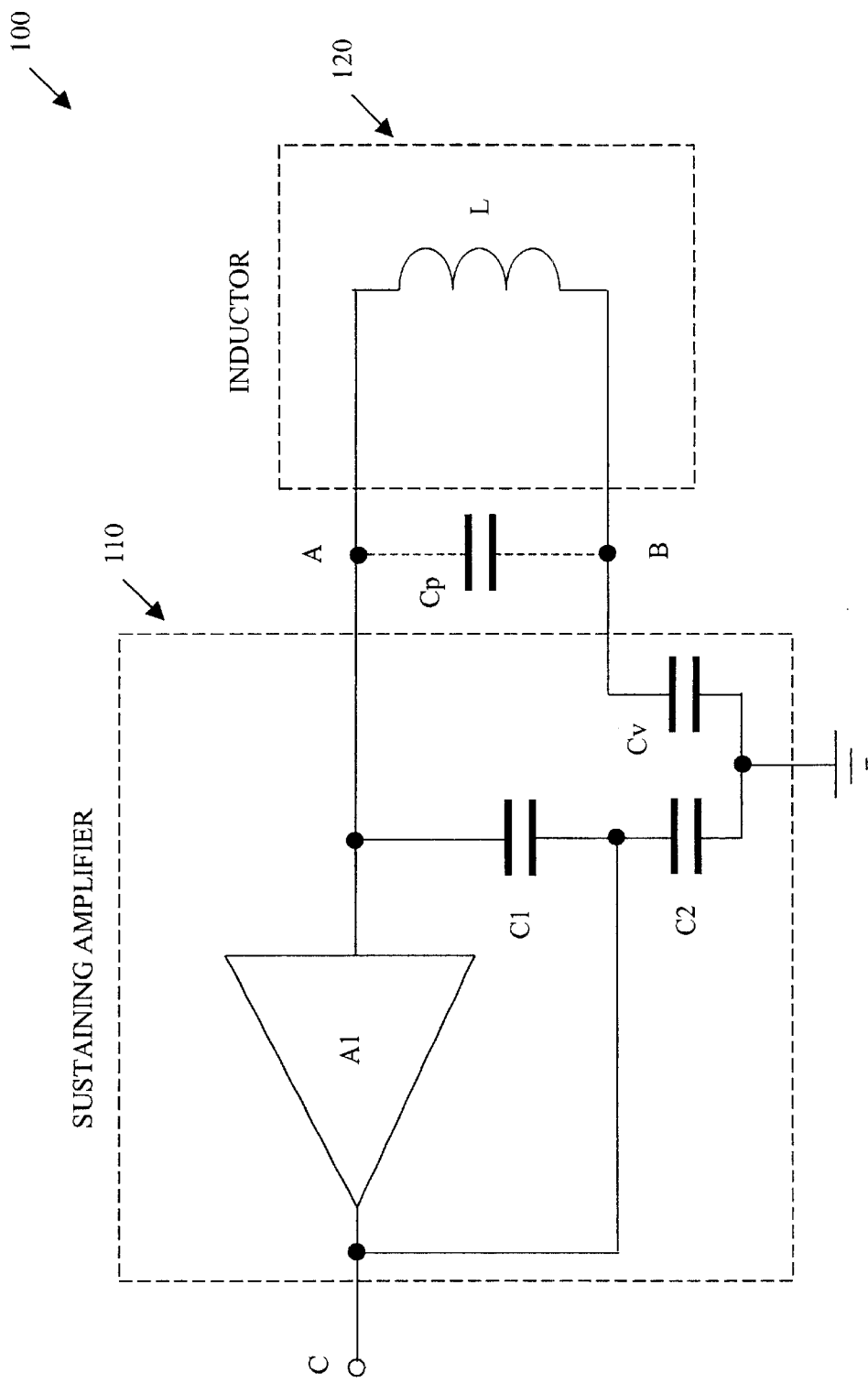
FIG. 1 illustrates a schematic diagram of a prior art oscillator.

Referring initially to FIG. 1, illustrated is a schematic diagram of a prior art oscillator 100. The oscillator 100 includes a sustaining amplifier 110 and an inductor 120 coupled across first and second terminals A, B associated with the oscillator 100. The sustaining amplifier 110 includes an amplifier A1 coupled to an output terminal C and first, second and third capacitors C1, C2, Cv. A parasitic capacitance Cp represents a distributed capacitive loading that is associated with the sustaining amplifier 110 and the inductor 120.

The oscillator 100 is representative of a harmonic oscillator. Although a Colpitts style oscillator is shown in the example of FIG. 1, the principle of operation is essentially identical for other harmonic oscillator configurations. An oscillatory waveform results at the output terminal C if the sustaining amplifier 110 has sufficient gain to overcome losses associated with the inductor 120 and any other sources of loss in the circuit. If however, the resistive loss of the inductor 120 is too large relative to the available gain of the sustaining amplifier 110, no oscillation is produced at the output terminal C. If oscillation does occur, the frequency of oscillation is determined by the combination of the inductance L of the inductor 120, and the total capacitance associated with the sustaining amplifier 110. In many applications, the frequency of oscillation is adjusted during manufacture or at a subsequent time during normal circuit operation. The third capacitor Cv may be varied to adjust the oscillation frequency of the oscillator 100.

Figure 2:
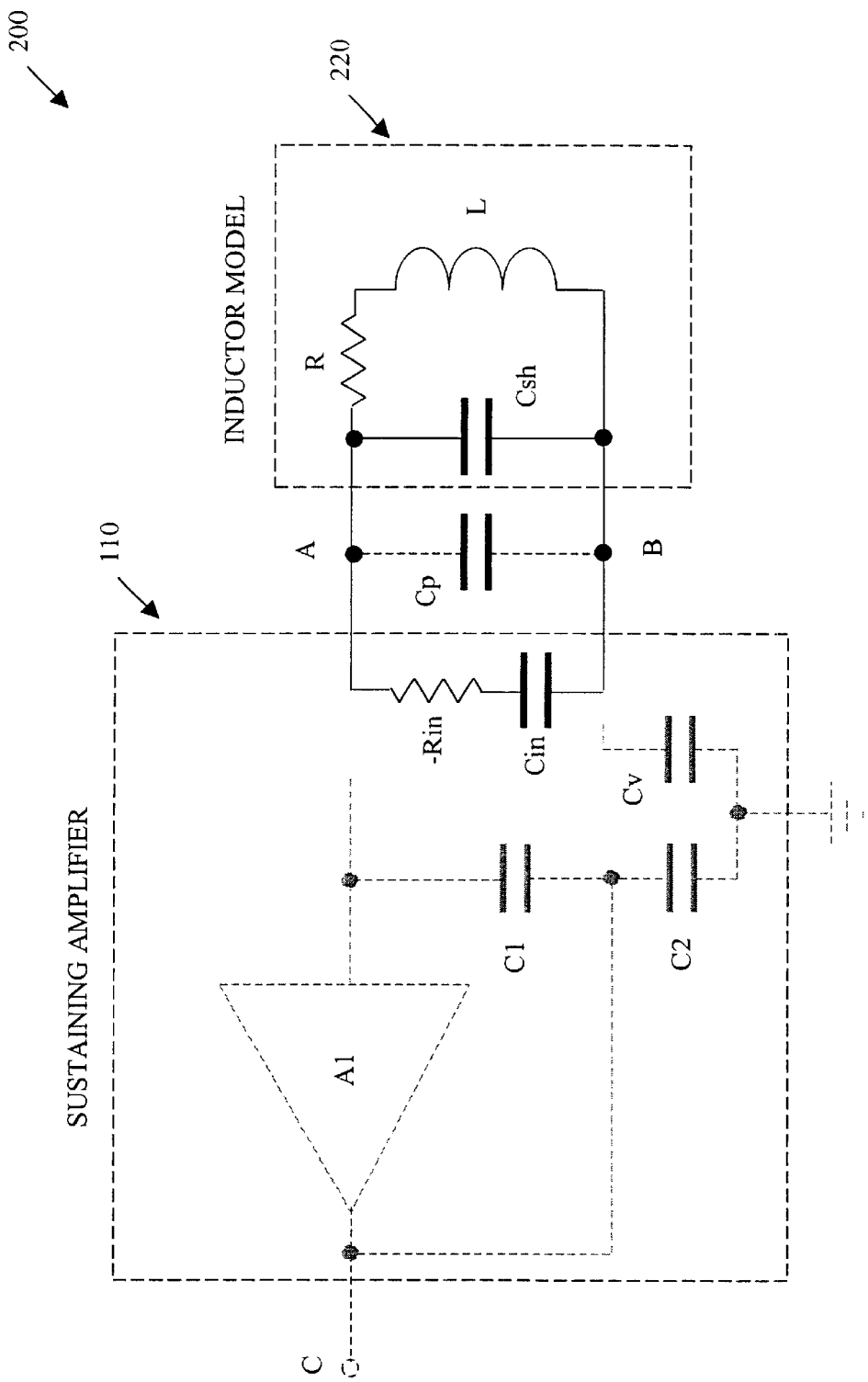
FIG. 2 illustrates a schematic diagram of a model of the oscillator of FIG. 1.

Turning now to FIG. 2, illustrated is a schematic diagram of a model 200 of the oscillator of FIG. 1. The model 200 includes an equivalent input resistance −Rin in series with an input capacitance Cin, representing the sustaining amplifier 110, and the parasitic capacitance Cp coupled to the first and second terminals A, B. The model 200 also includes an inductor model 220 (representing the inductor 120 of FIG. 1) having an inductance L, a series resistance R and a shunt capacitance Csh coupled to the first and second terminals A, B.

In the oscillator, the sustaining amplifier 110 provides just enough energy during each cycle of operation to compensate for losses in the resonant structure associated with the inductor model 220. In this fashion, the oscillations may continue indefinitely. The series resistance R is an element within the inductor model 220 that represents the resistance associated with the windings of the inductor 120. Similarly, the shunt capacitance Csh is an element within the inductor model 220 that represents the stray capacitance associated with the windings of the inductor 120. The equivalent input resistance −Rin of the sustaining amplifier 110 includes a negative real part, as indicated. The oscillator adjusts the value of the equivalent input resistance −Rin to match the magnitude of a real part REAL$\{Z_{AB}\}$ of the impedance $Z_{AB}$ across the first and second terminals A, B under steady-state oscillation conditions.

The impedance $Z_{AB}$ is dominated by the inductive reactance of the inductance L at low frequencies. However, at very high frequencies, the capacitive reactance of the parasitic and shunt capacitances Cp, Csh becomes less than the inductive reactance and dominates the impedance $Z_{AB}$. Between these two frequency extremes the inductor 120 exhibits a resonance due to the parasitic and shunt capacitances Cp, Csh and the inductance L. The real part REAL$\{Z_{AB}\}$ of the impedance $Z_{AB}$ across the first and second terminals A, B passes through a resonance that is typically orders of magnitude larger than the value of the series resistance R, as may be seen in FIG. 3.

Figure 3:
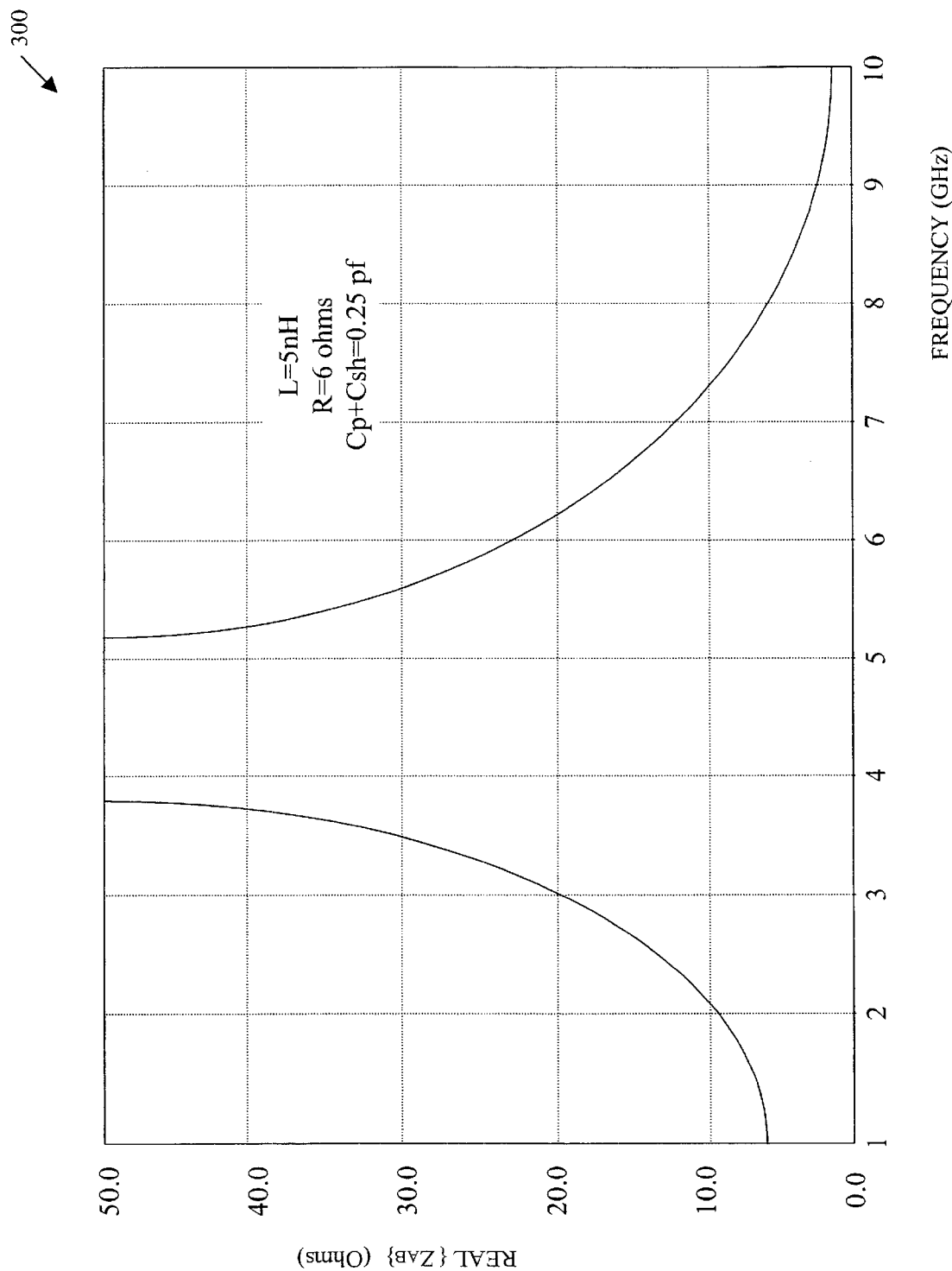
FIG. 3 illustrates a graph showing the real part of the impedance as a function of frequency across the first and second terminals associated with the inductor model of FIG. 2.

Turning now to FIG. 3, illustrated is a graph 300 showing the real part REAL$\{Z_{AB}\}$ of the impedance $Z_{AB}$ as a function of frequency across the first and second terminals A, B associated with the inductor model 220 of FIG. 2. The real part REAL$\{Z_{AB}\}$ may be expressed by the equation [1] below, $$REAL\{Z_{AB}\} = \frac{R}{\left[1 - \left(1 + \frac{\Delta\omega}{\omega_0}\right)^2\right]^2} \quad [1]$$

where:

$$\omega_0 = \frac{1}{\sqrt{L(Cp + Csh)}}$$

is the resonant frequency and $\Delta\omega$ is the frequency deviation from $\omega_0$.

As an example, for the values of:
L=5 nH,
(Cp+Csh)=0.25 pf, and
R=6 ohms,
an inductor "Q" of about 10 at 3 Ghz and a resonant frequency of about 4.50 Ghz is obtained. At a frequency of 3.0 Ghz (where $\Delta\omega$ equals 1.50 Ghz), the real part REAL$\{Z_{AB}\}$ of the impedance $Z_{AB}$ is about 19.5 ohms. Therefore, the effective real part of the inductor model 220 at a frequency of 3 Ghz has increased by about a factor of three from its low frequency value of 6 ohms. This impacts the ability of the sustaining amplifier 110 to maintain oscillation since a greater negative value of the input resistance −Rin is required to support oscillation. Additionally, this increased real part REAL$\{Z_{AB}\}$ of the impedance $Z_{AB}$ reduces the phase noise performance of the oscillator.

An increase in the combined values of the parasitic capacitance Cp and the shunt capacitance Csh, that is (Cp+Csh), by 0.1 pf increases the real part REAL$\{Z_{AB}\}$ of the impedance $Z_{AB}$ at 3 Ghz from 19.5 ohms to about 45 ohms. Similarly, a decrease in parasitic and shunt capacitances (Cp+Csh) by 0.10 pf reduces the real part REAL$\{Z_{AB}\}$ of the impedance $Z_{AB}$ from 19.5 ohms to 11 ohms. Therefore, the performance of the oscillator is extremely sensitive to the value of the shunt capacitance Csh, especially if the operating frequency is within a factor of two of the resonant frequency.

Figure 4:
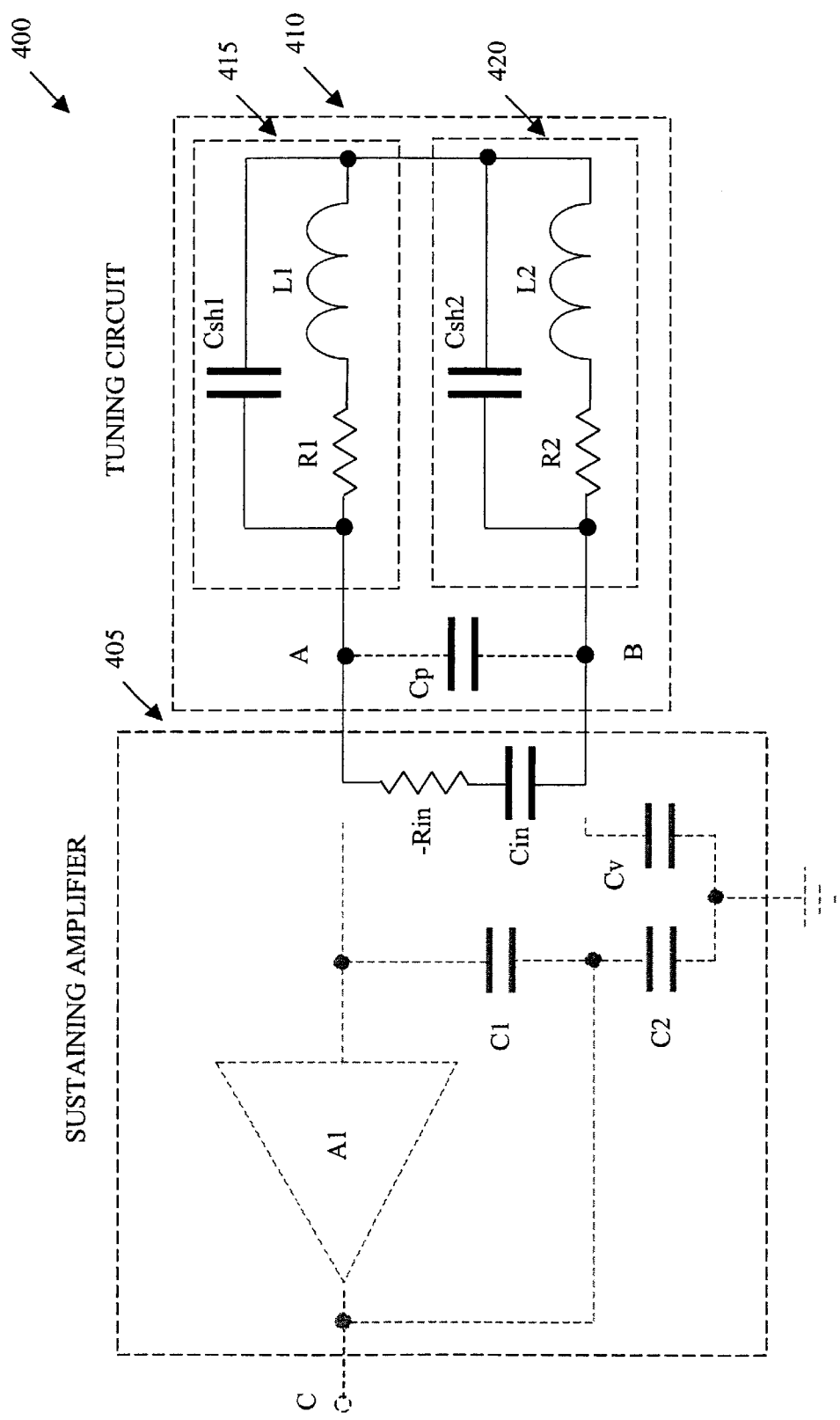
FIG. 4 illustrates a schematic diagram of an embodiment of an oscillator including an embodiment of a tuning circuit constructed according to the principles of the present invention.

Turning now to FIG. 4, illustrated is a schematic diagram of an embodiment of an oscillator 400 including an embodiment of a tuning circuit 410 constructed according to the principles of the present invention. The oscillator 400 includes a sustaining amplifier 405 (analogous to the sustaining amplifier 110 and associated model 200 illustrated in FIGS. 1 and 2, respectively) and the tuning circuit 410 coupled to first and second terminals A, B. The tuning circuit 410 includes first and second inductive elements 415, 420 that are series coupled (forming a segmented inductor circuit) and a parasitic capacitance Cp. The first inductive element 415 includes a first inductance L1, a first intrinsic resistance R1 and a first intrinsic shunt capacitance Csh1. The second inductive element 420 includes a second inductance L2, a second intrinsic resistance R2 and a second intrinsic shunt capacitance Csh2. The first and second inductive elements 415, 420 cooperate to reduce a total shunt capacitance Csh associated with the tuning circuit 410 thereby increasing its self-resonant frequency.

The first and second intrinsic shunt capacitances Csh1, Csh2 have values that are typically proportional to the values of their respective first and second inductances L1, L2. Therefore, decreasing the values of each of the first and second inductances L1, L2 proportionally decreases the value of their associated first and second intrinsic shunt capacitances Csh1, Csh2. Similarly, the values of the first and second intrinsic resistances R1, R2 also proportionally decrease.

Figure 5:
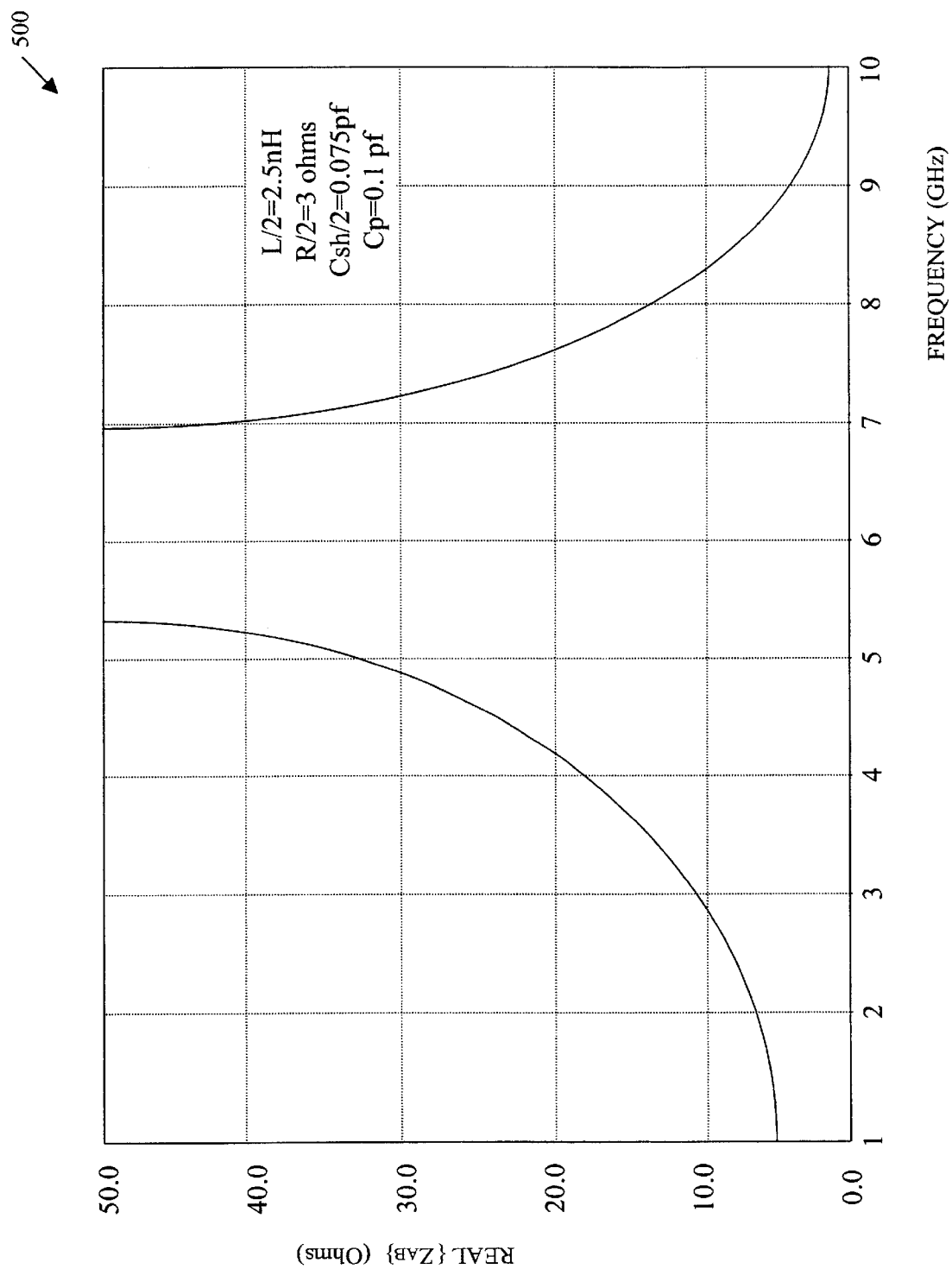
FIG. 5 illustrates a graph showing a real part of an impedance as a function of frequency across the first and second terminals associated with the tuning circuit of FIG. 4.

Turning now to FIG. 5, illustrated is a graph 500 showing a real part REAL$\{Z_{AB}\}$ of an impedance $Z_{AB}$ as a function of frequency across the first and second terminals A, B associated with the tuning circuit 410 of FIG. 4. In the illustrated embodiment, the first and second inductive elements have corresponding components that are chosen to be substantially equal in value. That is, both of the first and second inductances L1, L2 are substantially equal to half of the total inductance (L/2), both of the first and second intrinsic series resistances R1, R2 are substantially equal to half the total intrinsic resistance (R/2) and both of the first and second intrinsic shunt capacitances Csh1, Csh2 are substantially equal to half the total shunt capacitance (Csh/2).

As an example, for the values of:
L/2=2.5 nH,
Csh/2=0.075 pf,
R/2=3 ohms, and
Cp=0.10 pf,
a self-resonant frequency of about 6.25 Ghz is provided by the two-segment inductor topology of FIG. 4 as compared to the self-resonant frequency of 4.5 Ghz obtained with the single inductor of FIG. 1. This condition results in the real part REAL$\{Z_{AB}\}$ of the impedance $Z_{AB}$ being about 10.6 ohms at 3 Ghz, which is about a factor of two smaller than that shown in FIG. 3 and significantly closer to the low frequency value of 6 ohms. The structure of FIG. 4 is also significantly less-sensitive to variation in the parasitic capacitance Cp and the total shunt capacitance Csh as seen by the differences in the slope of the real part REAL$\{Z_{AB}\}$ at 3 Ghz in FIGS. 3 and 5.

In an alternative embodiment, this approach may be extended to more than two inductor segments. However, the maximum number of inductor segments may be limited since the lead inductance and shunt capacitance to connect many inductance elements can be significant relative to the shunt capacitance of the inductor element itself. Nevertheless, for a desired inductor value in a circuit application, an optimum number of segments will exist for a given frequency of operation.

The values of the total shunt capacitance Csh and the total intrinsic resistance R may not decrease exactly in proportion to value of the inductance value. Therefore, the decrease in the real part REAL$\{Z_{AB}\}$ of the impedance $Z_{AB}$ may not be as great as seen in the illustrated embodiment. For example, if the total shunt capacitance Csh is reduced to only 75 percent of its original value when an inductance L value of 2.5 nH is designed (Cp=0.10 pf and Csh/2=0.112 pf), the real part REAL$\{Z_{AB}\}$ of the impedance $Z_{AB}$ of the structure is reduced to 11.7 ohms. Hence, an increase of about 1 ohm occurs, which still provides a significant improvement.

Figure 6:
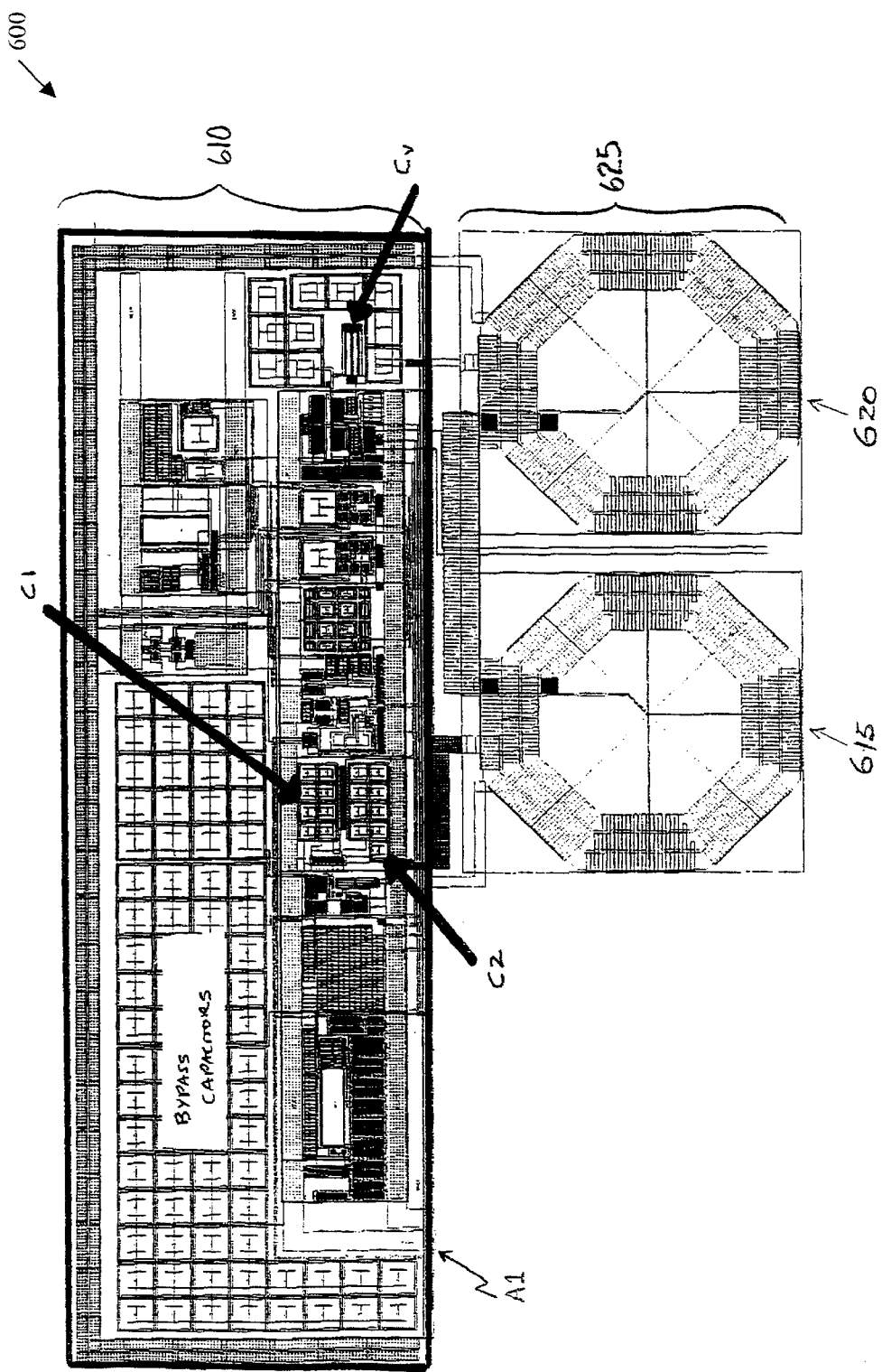
FIG. 6 illustrates a plan view of an embodiment of an oscillator embodied in an integrated circuit constructed according to the principles of the present invention.

Turning now to FIG. 6, illustrated is a plan view of an embodiment of an oscillator embodied in an integrated circuit 600 constructed according to the principles of the present invention. The oscillator includes the sustaining amplifier 610 and a tuning circuit 625. In the illustrated embodiment, the sustaining amplifier 610 includes the amplifier A1 and first, second and third capacitors C1, C2, Cv. The tuning circuit 625 includes first and second inductive elements 615, 620 wherein the inductive windings of each are clearly visible. In an alternative embodiment, the first and second inductive elements may be discrete and coupled to the integrated sustaining amplifier 610 or to a discrete sustaining amplifier 610 contained on a printed wire board.

While specific embodiments of a tuning circuit, oscillator and integrated circuit have been illustrated and described, other embodiments that take advantage of employing a segmented inductive element in a tuning circuit are well within the broad scope of the present invention. For a better understanding of oscillators and advantageous applications therefor see the following references, namely, U.S. Pat. No. 5,025,229, entitled "Voltage-Controlled Oscillator using a Surface Elastic Wave Resonator", by Hasegawa, et al., issued on Jun. 18, 1991, U.S. Pat. No. 5,606,295, entitled "Crystal Oscillator Circuits", by Ohara, et al., issued on Feb. 25, 1997, U.S. Pat. No. 4,063,193, entitled "Differential Transistor Pair Integrated Circuit Oscillator with L-C Tank Circuit", by Wilcox, issued on Dec. 13, 1977, and for integrated circuit design in relation to inductive elements see U.S. Pat. No. 6,101,371, entitled "Article Comprising an Inductor," by Bradley P. Barber, et al., issued on Aug. 8, 2000. Also, for a better understanding of the design challenges associated with elements of tuned circuits see "RF Circuit Design Aspects of Spiral Inductors in Silicon," by Joachim N. Burghartz, et al., IEEE Journal of Solid-State Circuits, Vol. 33, No. 12, pps. 2028–2034, December 1998, "Optimization of High Q CMOS-Compatible Microwave Inductors using Silicon CMOS Technology," by Min Park, et al., IEEE MIT-S Digest, pps. 129–132, June 1997, "Microwave Inductors and Capacitors in Standard Multilevel Interconnect Silicon Technology," by Joachim N. Burghartz, et al., IEEE Transactions on Microwave Theory and Techniques, Vol. 44, No. 1, pps. 100–104, January 1996, and "Design of Crystal and Other Harmonic Oscillators", by B. Parzen with Arthur Ballato, John Wiley & Sons, New York, 1983. The aforementioned references are all incorporated herein by reference.

Although the present invention and its advantages have been described in detail, those skilled in the art should understand that they can make various changes, substitutions and alterations herein without departing from the spirit and scope of the invention in its broadest form.

What is claimed is:

1. A segmented inductor circuit for use with a tuning circuit configured to exhibit a total inductance, comprising:
    a first inductive element; and
    a second inductive element coupled in series with said first inductive element, an inductance of said first and second inductive elements substantially equal to said total inductance, said first and second inductive elements adapted to cooperate to reduce a total shunt capacitance associated with said first and second inductive elements and provide a smaller value of a real part of an impedance associated with said total inductance at a given frequency.

2. The segmented inductor circuit as recited in claim 1 wherein said first and second inductive elements have first and second intrinsic resistances, respectively.

3. The segmented inductor circuit as recited in claim 1 wherein said first and second inductive elements are substantially equal.

4. The segmented inductor circuit as recited in claim 3 wherein said total shunt capacitance is approximately half a first intrinsic shunt capacitance associated with said first inductive element or a second intrinsic shunt capacitance associated with said second inductive element.

5. The segmented inductor circuit as recited in claim 1 wherein said tuning circuit exhibits a parasitic capacitance across terminals associated therewith.

6. The segmented inductor circuit as recited in claim 1 wherein said first and second inductive elements are discrete.

7. The segmented. inductor circuit as recited in claim 1 further comprising a third inductive element, coupled in series with said second inductive element, an inductance of said first, second and third inductive elements substantially equal to said total inductance, said first, second and third inductive elements adapted to cooperate to reduce a total shunt capacitance associated with said first, second and third inductive elements.

8. The segmented inductor circuit as recited in claim 1 wherein said segmented inductor circuit is embodied in an integrated circuit.

9. A tuning circuit, comprising:
    a first inductive element having a first intrinsic shunt capacitance; and
    a second inductive element, coupled in series with said first inductive element, having a second intrinsic shunt capacitance, said first and second inductive elements configured to exhibit a total inductance and provide a smaller value of a real part of an impedance associated with said total inductance at a given frequency, and adapted to cooperate to reduce a total shunt capacitance associated with said first and second inductive elements thereby increasing a self-resonant frequency of said tuning circuit.

10. The tuning circuit as recited in claim 9 wherein said first and second inductive elements have first and second intrinsic resistances, respectively.

11. The tuning circuit as recited in claim 9 wherein said first and second inductive elements are substantially equal.

12. The tuning circuit as recited in claim 11 wherein said total shunt capacitance is approximately half said first intrinsic shunt capacitance or said second intrinsic shunt capacitance.

13. The tuning circuit as recited in claim 9 wherein said tuning circuit exhibits a parasitic capacitance across terminals associated therewith.

14. The tuning circuit as recited in claim 9 wherein said first and second inductive elements are discrete.

15. The tuning circuit as recited in claim 9 wherein said tuning circuit is employable with an oscillator.

16. The tuning circuit as recited in claim 9 wherein said tuning circuit is embodied in an integrated circuit.

17. A method of increasing a self-resonant frequency of a tuning circuit, comprising:
    providing a first inductive element having a first intrinsic shunt capacitance; and
    series coupling a second inductive element, having a second intrinsic shunt capacitance, with said first inductive element, said first and second inductive elements exhibiting a total inductance and providing a smaller value of a real part of an impedance associated with said total inductance at a given frequency, and cooperating to reduce a total shunt capacitance associated with said first and second inductive elements thereby increasing said self-resonant frequency of said tuning circuit.

18. The method as recited in claim 17 wherein said first and second inductive elements have first and second intrinsic resistances, respectively.

19. The method as recited in claim 17 wherein said first and second inductive elements are substantially equal.

20. The method as recited in claim 19 wherein said total shunt capacitance is approximately half said first intrinsic shunt capacitance or said second intrinsic shunt capacitance.

21. The method as recited in claim 17 wherein said tuning circuit exhibits a parasitic capacitance across terminals associated therewith.

22. The method as recited in claim 17 wherein said first and second inductive elements are discrete.

23. The method as recited in claim 17 wherein said tuning circuit is employable with an oscillator.

24. The method as recited in claim 17 wherein said tuning circuit is embodied in an integrated circuit.

25. An oscillator, comprising:

an amplifier that provides energy to sustain operation of said oscillator; and a tuning circuit, coupled to said amplifier, that determines a frequency of oscillation, including:

a first inductive element having a first intrinsic shunt capacitance, and a second inductive element, coupled in series with said first inductive element, having a second intrinsic shunt capacitance, said first and second inductive elements configured to exhibit a total inductance and provide a smaller value of a real part of an impedance associated with said total inductance at a given frequency, and adapted to cooperate to reduce a total shunt capacitance associated with said first and second inductive elements thereby increasing a self-resonant frequency of said tuning circuit.

26. The oscillator as recited in claim 25 wherein said first and second inductive elements have first and second intrinsic resistances, respectively.

27. The oscillator as recited in claim 25 wherein said first and second inductive elements are substantially equal.

28. The oscillator as recited in claim 27 wherein said total shunt capacitance is approximately half said first intrinsic shunt capacitance or said second intrinsic shunt capacitance.

29. The oscillator as recited in claim 25 wherein said tuning circuit exhibits a parasitic capacitance across terminals associated therewith.

30. The oscillator as recited in claim 25 wherein said first and second inductive elements are discrete.

31. The oscillator as recited in claim 25 wherein said oscillator is embodied in an integrated circuit.

* * * * *